(12) United States Patent
Van Der Sijde et al.

(10) Patent No.: US 10,490,428 B2
(45) Date of Patent: Nov. 26, 2019

(54) METHOD AND SYSTEM FOR DUAL STRETCHING OF WAFERS FOR ISOLATED SEGMENTED CHIP SCALE PACKAGES

(71) Applicant: Lumileds LLC, San Jose, CA (US)

(72) Inventors: Arjen Gerben Van Der Sijde, Eindhoven (NL); Nicola Bettina Pfeffer, Eindhoven (NL); Brendan Jude Moran, San Jose, CA (US)

(73) Assignee: Lumidleds LLC, San Jose, CA (US)

( * ) Notice: Subject to any disclaimer, the term of this patent is extended or adjusted under 35 U.S.C. 154(b) by 0 days.

(21) Appl. No.: 15/951,775

(22) Filed: Apr. 12, 2018

(65) Prior Publication Data

US 2019/0198365 A1    Jun. 27, 2019

Related U.S. Application Data

(60) Provisional application No. 62/609,524, filed on Dec. 22, 2017.

(51) Int. Cl.
*H01L 21/67* (2006.01)
*H01L 23/00* (2006.01)

(52) U.S. Cl.
CPC ........ *H01L 21/67132* (2013.01); *H01L 24/96* (2013.01); *H01L 24/97* (2013.01); *H01L 2924/01015* (2013.01)

(58) Field of Classification Search
None
See application file for complete search history.

(56) References Cited

U.S. PATENT DOCUMENTS 7,517,725 B2    4/2009  Reis
7,915,690 B2    3/2011  Shen

2005/0194605 A1    9/2005  Shelton et al.
2010/0279437 A1    11/2010 Neff et al.
2015/0008466 A1*   1/2015  Bierhuizen ......... H01L 33/0095
                                                        257/98

FOREIGN PATENT DOCUMENTS

EP    2998991 A1    3/2016
EP    2998991 A1    3/2016

OTHER PUBLICATIONS

"European Application Serial No. 18167766.7, Extended European Search Report dated Jan. 18, 2019", 13 pgs.
"European Application Serial No. 18167766.7, Partial European Search Report dated Oct. 2, 2018", 14 pgs.

* cited by examiner

*Primary Examiner* — Thien F Tran
(74) *Attorney, Agent, or Firm* — Schwegman Lundberg & Woessner, P.A.

(57) ABSTRACT

Described herein is a method and system for dual stretching of wafers to create isolated segmented chip scale packages. A wafer having an array of light-emitting diodes (LEDs) is scribed into LED segments, where each LED segment includes a predetermined number of LEDs. The scribed wafer is placed on a stretchable substrate or tape. The tape is stretched and a layer of optically material is placed in the separation gaps. The stretched wafer is scribed on a LED level. The tape is stretched and another layer of optically opaque material is placed in the separation gaps. The same or different optically opaque material can be used for the layers. The two layers of optically opaque material are formed to provide electrical connectivity between the LEDs in each LED segment. In an implementation, each segment or LED is individually addressable.

14 Claims, 9 Drawing Sheets

METHOD AND SYSTEM FOR DUAL STRETCHING OF WAFERS FOR ISOLATED SEGMENTED CHIP SCALE PACKAGES

CROSS REFERENCE TO RELATED APPLICATION(S)

This application claims the benefit of U.S. Provisional Application Ser. No. 62/609,524 filed Dec. 22, 2017, which is incorporated by reference as if fully set forth.

FIELD OF THE INVENTION

This application is related to light-emitting diode packaging.

BACKGROUND

Segmented matrix light-emitting diodes (LEDs) can be used in camera flash or lighting applications (referred to as "adaptive flash") to illuminate a scene more homogenously. These segmented matrix LEDs devices avoid overexposure by diming the flash light on objects close by and instead use the flash light for objects that are further away. Creating a segmented matrix LED can be expensive unless wafer level processing is used.

To achieve a good contrast in the scene illumination, the optics essentially image the LED onto the scene. Any color variations of the source luminance could lead to color shading in the scene. For white LEDs, typical color variations originate from locally over-converting the light, (i.e., yellow light by e.g. locally thicker phosphor layers). For segmented LEDs, the risk is even higher. Typically, one segment could be switched on while the neighbor segment is still off. With a monolithic matrix LED, the sapphire or phosphor layer could be thought of as made from one piece or block. Unfortunately, this can lead to light guiding inside each of the blocks, i.e. the sapphire and phosphor blocks. Due to different extraction efficiencies in each of the blocks, e.g., blue light from the sapphire block and yellow from the phosphor block, white segments, (which are approximately the targeted sum of blue and yellow light), may have a yellow rim, ("over" converted light in the phosphor layer).

Scene illumination with adaptive flash or adaptive infrared (IR) requires that the illumination sources, whether IR or visible light sources, be well separated in order to maximize contrast. Wafer level processing of light emitters is preferred for cost and reliability reasons, but widely separating the light emitters on a wafer would waste space and increase costs. Moreover, space is precious in the end products such as mobile phones. The imaging optics would also be challenged if the separation lines in the emitter were too broad. Wafer level processing that ends with closely packed but optically well separated light emitters in the same package is needed.

SUMMARY

Described herein is a method and system for dual stretching of wafers to create isolated segmented chip scale packages. A wafer having an array of light-emitting diodes (LEDs) is scribed into segments, where each segment includes a predetermined number of LEDs. The scribed wafer is placed on a stretchable substrate or tape. The tape is stretched and a layer of optically opaque, either highly reflective or absorbing, material is placed in the separation gaps. The stretched wafer is scribed on a LED level. The tape is stretched and another layer of optically opaque material is placed in the separation gaps. The two layers of optically opaque material can be chosen to also provide electrical connectivity between the LEDs in each segment. In an implementation, each segment or LED is individually addressable.

BRIEF DESCRIPTION OF THE DRAWINGS

A more detailed understanding may be had from the following description, given by way of example in conjunction with the accompanying drawings wherein.

DETAILED DESCRIPTION

It is to be understood that the figures and descriptions for a method and system for dual stretching of wafer for isolated chip scale package segments have been simplified to illustrate elements that are relevant for a clear understanding, while eliminating, for the purpose of clarity, many other elements found in typical device processing. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Figure 1:
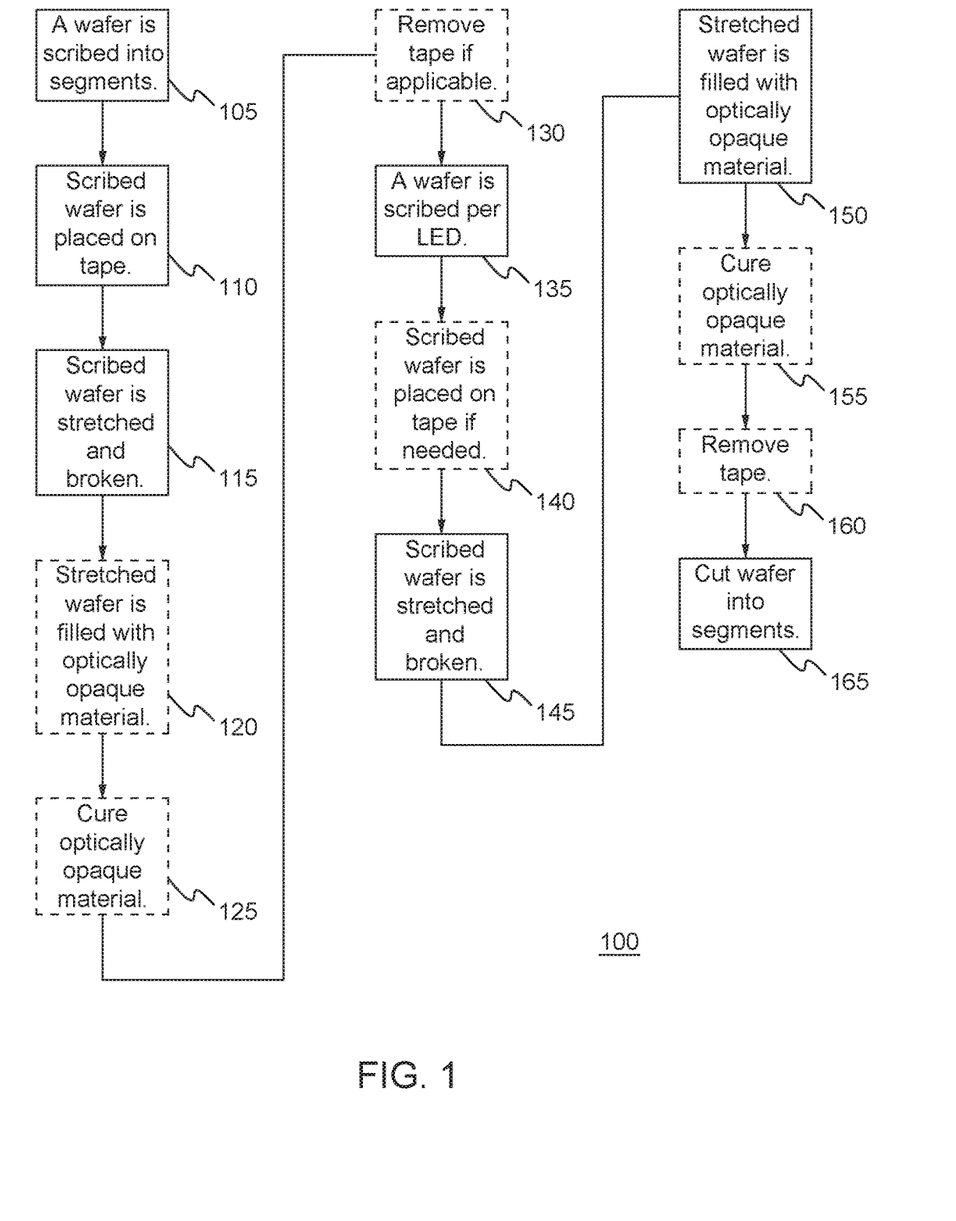
FIG. 1 is a flowchart of a method for dual stretching of a wafer for isolated chip scale package segments in accordance with an implementation.
Figure 2:
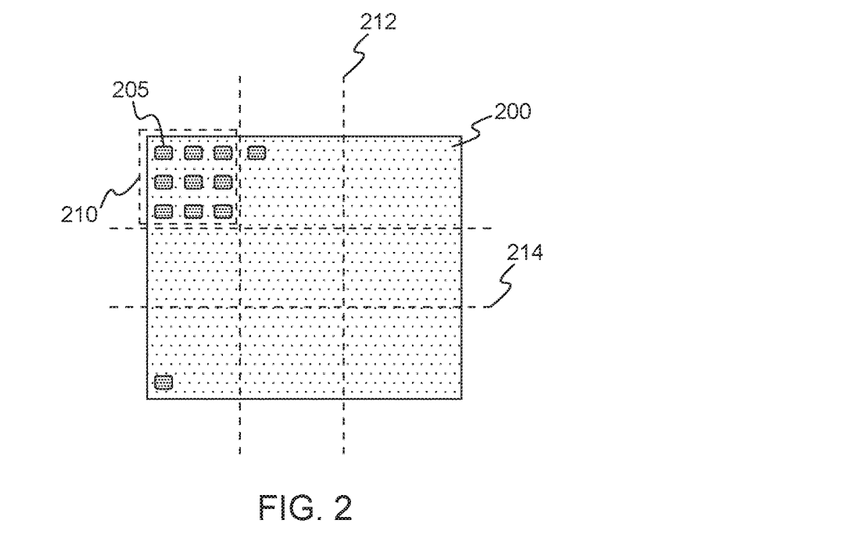
FIG. 2 is an example wafer portion that is scribed in accordance with the flowchart of FIG. 1.

Described herein is a method and system for dual stretching of wafer for isolated segmented chip scale package. FIG. 1 is a flowchart of a method 100 for dual stretching of wafer for isolated segmented chip scale package in accordance with an implementation. FIG. 1. is described in conjunction with FIGS. 2-7, which depicts a wafer or wafer portion, (collectively referred to as wafer herein), as it undergoes method 100. A wafer 200 having an array of light-emitting diodes (LEDs) or light emitters 205 is scribed in segments 210 as shown in FIG. 2 (105). In particular, FIG. 2 illustrates vertical scribe lines 212 and horizontal scribe lines 214. In an implementation, scribing can be implemented in one direction or both directions. LEDs 205 can include, but are not limited to, vertical-cavity surface-emitting lasers (VCSELs), and visible light emitters. LEDs 205 can be configured for any color.

Figure 3:
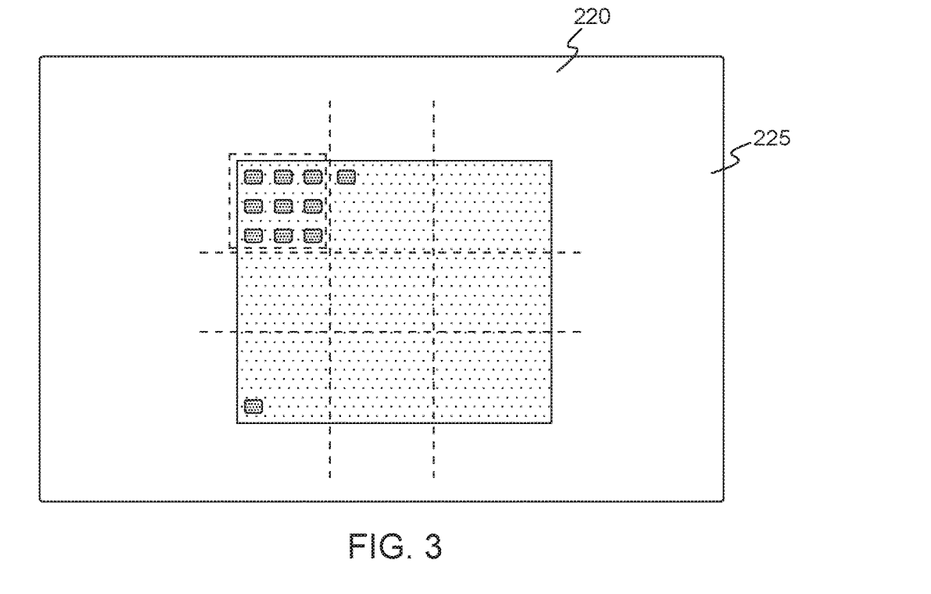
FIG. 3 is an example scribed wafer portion on a tape in accordance with the flowchart of FIG. 1.
Figure 4:
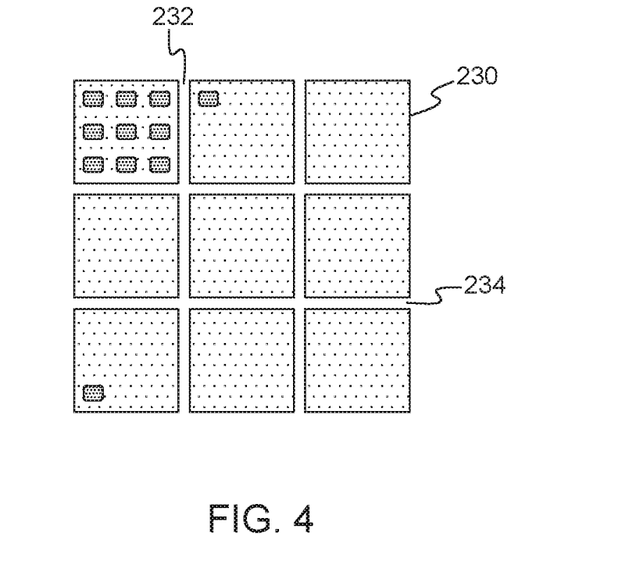
FIG. 4 is an example wafer portion that is stretched in accordance with the flowchart of FIG. 1.
Figure 5:
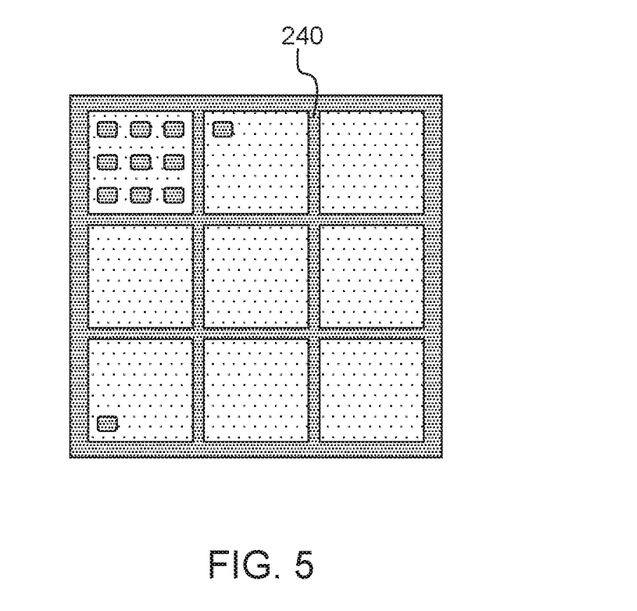
FIG. 5 is an example wafer portion that is filled with an optically opaque material in accordance with the flowchart of FIG. 1.

A scribed wafer 220 is placed on a stretchable substrate or tape 225, (collectively referred to as tape herein), as shown in FIG. 3 (110). In an implementation, wafer 200 can be placed on tape 225 and then scribed. Tape 225 is stretched to separate along vertical scribe lines 212 and horizontal scribe lines 214, resulting in a separated wafer 230 with vertical separation gaps 232 and horizontal separation gaps 234 as shown in FIG. 4 (115). An optically opaque material 240 is deposited in vertical separation gaps 222 and horizontal separation gaps 224 as shown in FIG. 5 (120). Optically opaque material 240 can be, but is not limited to, Titanium Oxide embedded in silicone, dielectric layers forming a distributed Bragg reflector (DBR), metal and other similar materials. In an implementation, optically opaque material 240 is generally of a particle size that permits flow into vertical separation gaps 232 and horizontal separation gaps 234 via, for example, capillary forces. Optically opaque material 240 in then allowed to harden or cure, as appropriate (125). In an implementation, metal deposition techniques including, but not limited to, sputtering or anisotropic grow processes with lift-off techniques or 3D printing electrodeposition can be used when the optically opaque material 240 is metal. In an implementation where only one direction is scribed, the above process (steps 100-125) can be repeated for the other direction. In an implementation, tape 225 is re-used for a second stretching process. In an implementation, tape 225 can be removed (130).

Figure 6:
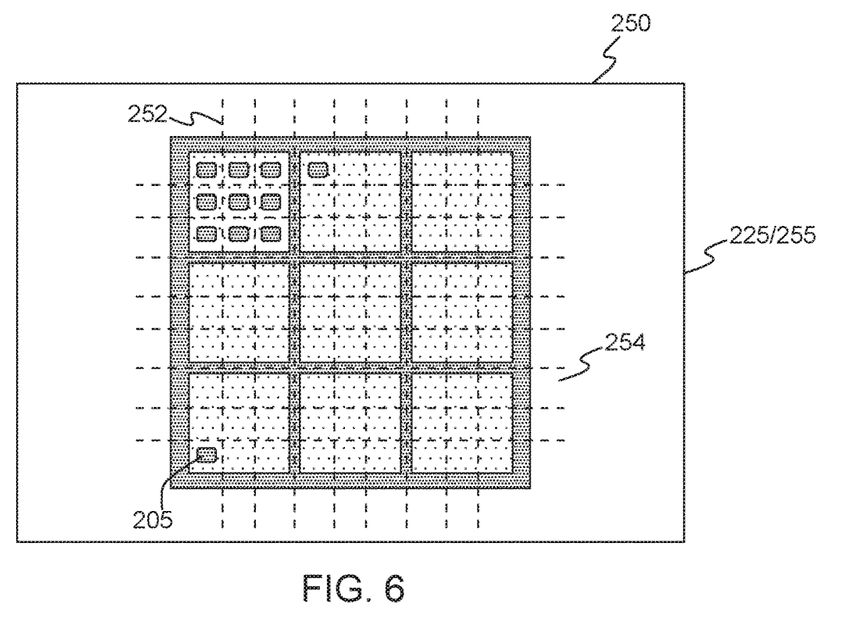
FIG. 6 is an example wafer portion that is scribed in segments in accordance with the flowchart of FIG. 1.
Figure 7:
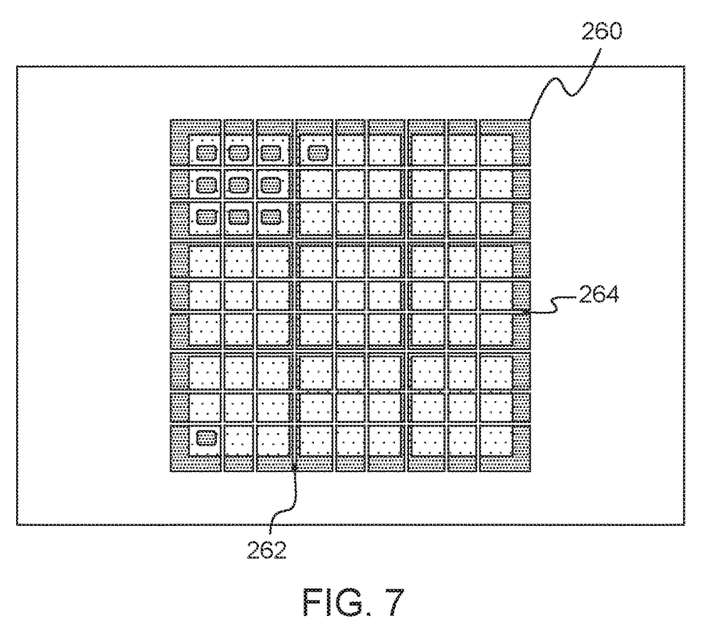
FIG. 7 is an example wafer portion that is stretched in segments in accordance with the flowchart of FIG. 1.
Figure 8:
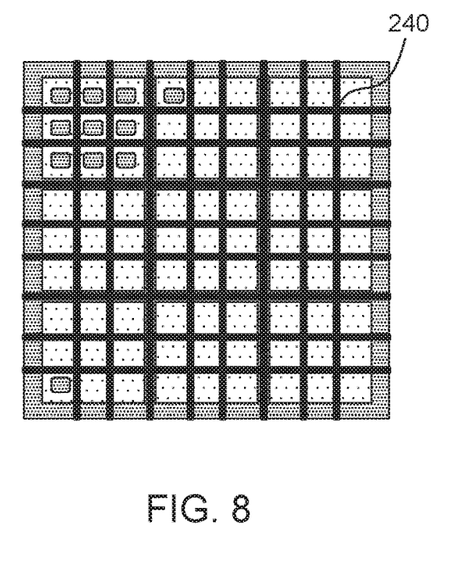
FIG. 8 is an example wafer portion that is filled in segments in accordance with the flowchart of FIG. 1.

A first stretched wafer 250 is then scribed on a LED 205 level as shown in FIG. 6 (135). In particular, FIG. 6 illustrates vertical scribe lines 252 and horizontal scribe lines 254. In an implementation where tape 225 has been removed, first stretched wafer 250 is placed on a second tape 255 (140). Tape 225 or 255 is stretched to separate along vertical scribe lines 252 and horizontal scribe lines 254, resulting in a second separated wafer 260 with vertical separation gaps 262 and horizontal separation gaps 264 as shown in FIG. 7 (145). Optically opaque material 240 is deposited in vertical separation gaps 262 and horizontal separation gaps 264 as shown in FIG. 8 (150). Optically opaque material 240 in then allowed to harden or cure, as appropriate (155). In an implementation where only one direction is scribed, the above process (steps 135-155) can be repeated for the other direction. In an implementation, tape 225/255 is removed (160). Each of the segments 210 is then cut using known techniques (165).

In an implementation, different materials can be used for optically opaque material 240 for filling separation gaps. In an implementation, multiple layers of optically opaque material 240 can be deposited as described herein below.

In an implementation, where optically opaque material 240 is a metal, the layers of optically opaque material are formed and configured to provide electrical connectivity between the LEDs in each segment. In an implementation, a non-conductive or insulation layer or film can be deposited to provide electrical separation between the metal layers. In an implementation, photoresist masks can be used to implement contacts to the LEDs. Other techniques known to one of skill in the art can be used to effectuate electrical connections to the LEDs. In an implementation, use of large bottom pads on the LEDs and side metal contacts can increase thermal performance. In an implementation, the configuration of the layers allows each LED or group of LEDs to be individually addressable.

Figure 9:
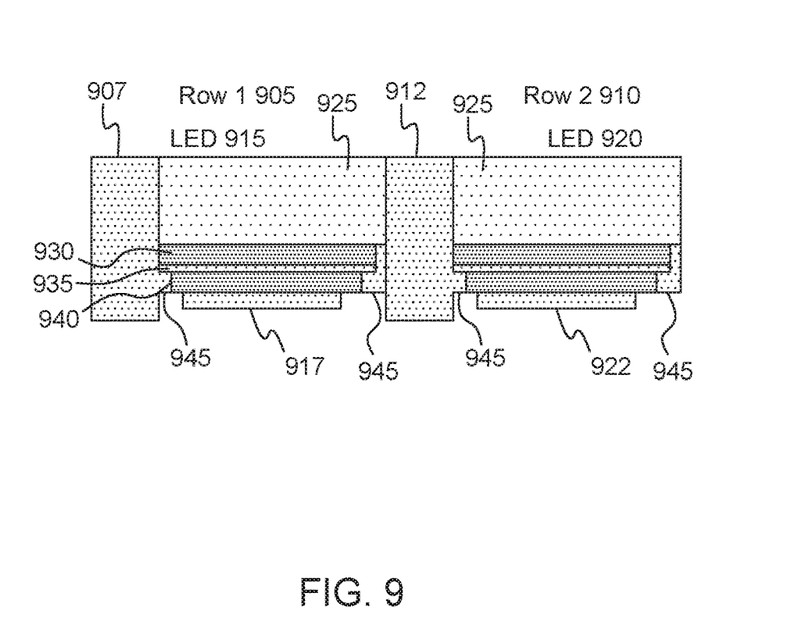
FIG. 9 is a cross-sectional view of a flip chip package in accordance with an implementation.
Figure 10:
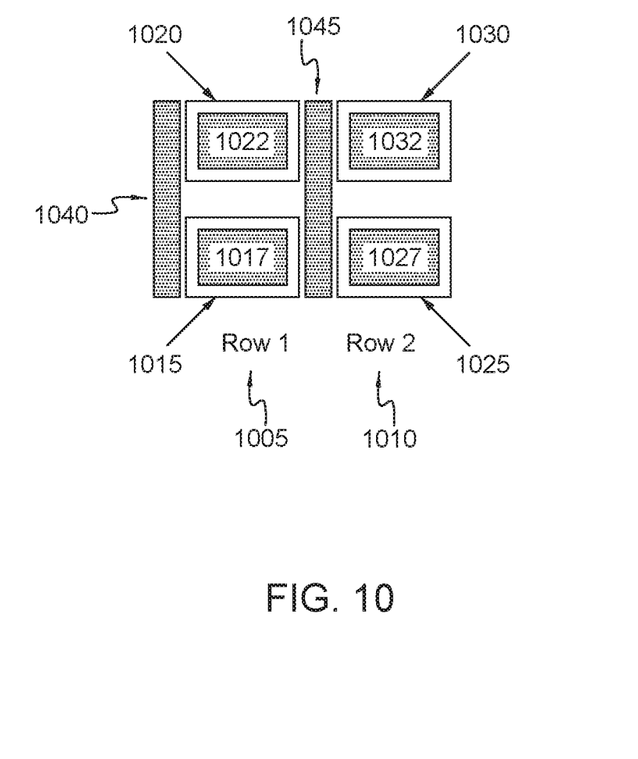
FIG. 10 is a top or bottom view of a flip chip package in accordance with an implementation.
Figure 11:
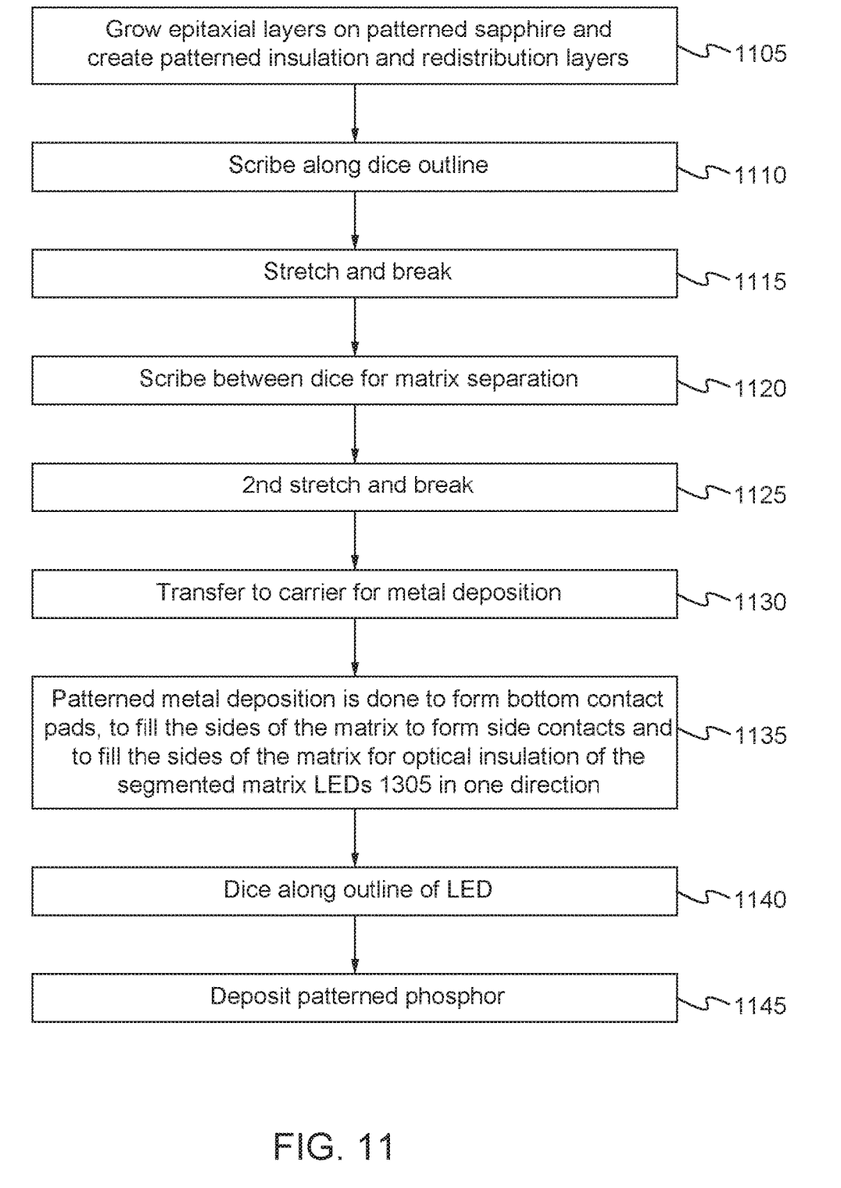
FIG. 11 is another flowchart of a method for dual stretching of a wafer for isolated chip scale package segments in accordance with an implementation.

FIGS. 9 and 10 are illustrative cross-sectional and top/bottom views of the isolated segmented chip packages made in accordance with the flowcharts of FIG. 1 or FIG. 11 as appropriate.

FIG. 9 is a cross-sectional view of a flip chip package 900 in accordance with certain implementations. Flip chip package 900 includes at least two rows, row 1 905 and row 2 910. Row 1 905 includes LED 915 and row 2 910 includes LED 920. Each LED 915 and 920 includes a patterned sapphire substrate 925 on which is grown a n-type Gallium Nitride (GaN) layer 930, an active layer 935 and a p-type GaN layer 940. Active layer 935 can be configured to include a light emitting diode. LEDs 915 and 920 each have a bottom/top contact pad 917 and 922, respectively, for contacting with p-type GaN layer 940, for example. Row 1 905 and row 2 910 each have a side contact pad 907 and 912, respectively, i.e., optically opaque material 240, for contacting to n-type GaN layer 930. Insulation layers 945 are deposited to provide electrical separation to enable addressability.

FIG. 10 is a bottom/top view of a flip chip package 1000. Flip chip package 1000 includes at least two rows, row 1 1005 and row 2 1010. Row 1 1005 includes multiple LEDs, for example LEDs 1015 and 1020, and row 2 1010 includes LEDs 1025 and 1030. Each LED has bottom/top contact pad for contacting to an n-type GaN layer or a p-type GaN layer in the LED as shown in FIG. 9. For example, LEDs 1015, 1020, 1025 and 1030 each have a bottom/top contact pad 1017, 1022, 1027 and 1032, respectively. Each row has a side contact pad, i.e., optically opaque material 240, for contacting to a remaining one of n-type GaN layer or p-type GaN layer in the LED. For example, in row 1 1005, side contact pad 1040 contacts LEDs 1015 and 1020 and side contact pad 1045 contacts LEDs 1025 and 1030.

Figure 12:
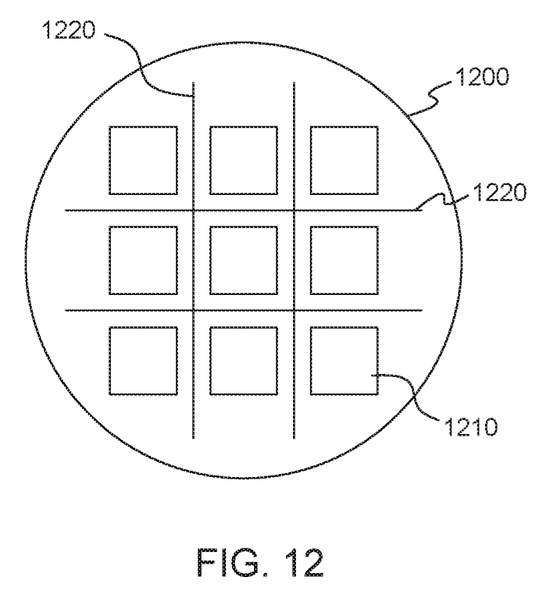
FIG. 12 is an illustrative example of scribing along LED outlines in accordance with an implementation.
Figure 13:
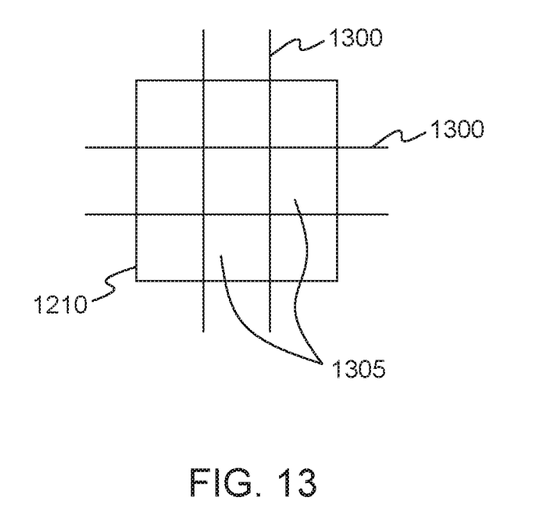
FIG. 13 is an illustrative example of scribing each LED in accordance with an implementation.

FIG. 11 is another flowchart of a method 1100 for dual stretching of a wafer for isolated chip scale package segments in accordance with an implementation. An illustrative wafer 1200 is shown in FIG. 12. The wafer 1200 is for example a patterned sapphire substrate. Epitaxial layers are grown on a patterned sapphire substrate and patterned insulation and redistribution layers are created (1105). The wafer has, for example, LEDs 1210. The wafer 1200 is placed on a tape and scribed along an outline 1220 of dice or LEDs 1210 (1110). The wafer 1200 is stretched and broken by stretching the tape (1115). The once broken wafer 1200 is scribed a 2nd time along interior scribe lines 1300 (as shown in FIG. 13) for each of the LEDs 1210 for matrix separation (i.e. to create segmented matrix LEDs 1305 from each of the LEDs 1210) (1120). The tape is stretched and broken again (1125). The separation lanes (formed along scribe lines 1220) for the LEDs 1210 (which are now twice stretched) will be bigger than the separation lanes formed along interior scribe lines 1300 of the LEDs 1210. This makes it easier to separate the LEDs 1210 and leaves smaller gaps only between the segmented matrix LEDs 1305.

The now segmented wafer 1200 on the twice stretched tape is transferred to a sputter compliant carrier, for example a glass substrate for metal deposition, e.g. aluminum (1130). Patterned metal deposition is done to form bottom contact pads, to fill the sides of the matrix to form side contacts in one direction and to fill the sides of the matrix for optical insulation of the segmented matrix LEDs 1305 in another direction (1135). For example, side contacts are formed in a vertical or horizontal direction. The remaining direction, horizontal or vertical, is filled with optical insulation material. The metal filling is done to the depth necessary to ensure side electrical contact with n-type GaN layer 930, for example. After sputtering, targeted patterned design can be done by an etching step to remove excess or unwanted metal. The insulation material 945, for example, is selected or coated with, for example, silicon nitride or silicon oxide, to create an etching stop. Optical insulation is finalized by filling horizontal lanes, (gap between 1020 and 1015 as well as 1030 and 1025 in FIG. 10), for example, and by filling the partially filled vertical lanes (1040 and 1045 in FIG. 10), for example, as needed. The wafer 1210 is diced along the outlines 1220 of the LEDs 1210 (1140). Patterned phosphor deposition is done on each of the diced LEDs 1210 (1150).

In an implementation, filling can be done after the first stretch and after the 2nd stretch. This allows the use of a different material for the 2 gaps. In an implementation, gaps are filled only after the 2 stretches.

Figure 14:
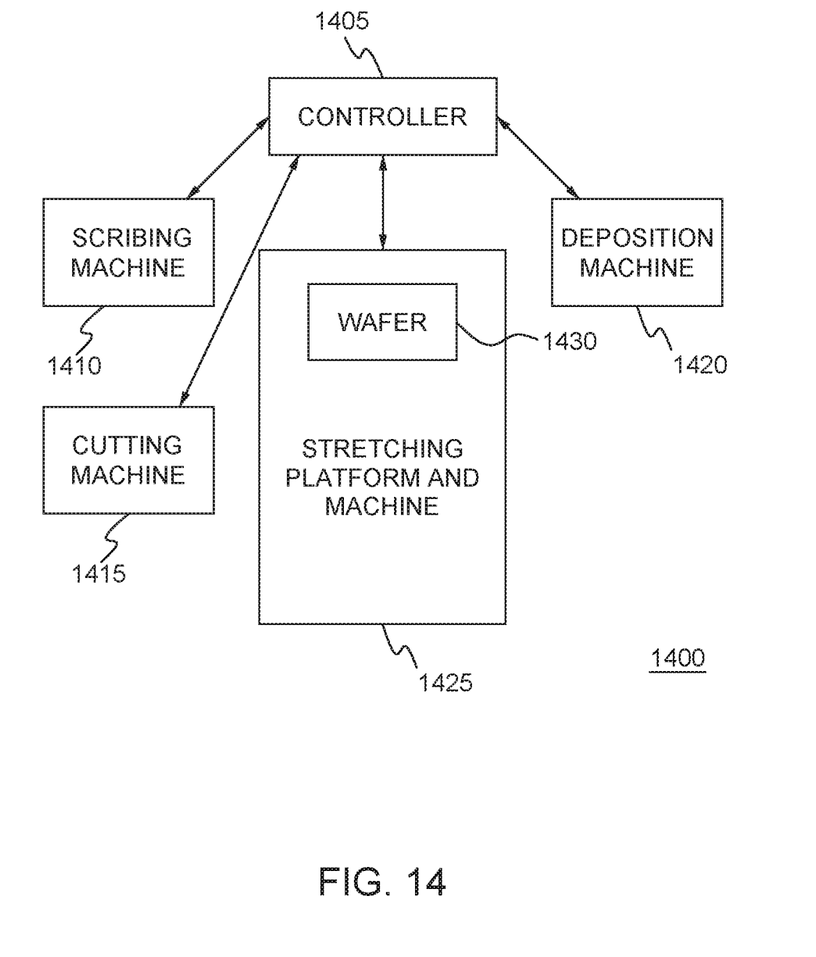
FIG. 14 is a system for implementing the flowcharts of FIG. 1 and FIG. 11 and producing the packages of FIG. 9 and FIG. 10 in accordance with an implementation.

FIG. 14 is a system 1400 for implementing the flowchart of FIG. 1 in accordance with an implementation. System 1400 can include a controller 1405 communicatively coupled or connected to, (collectively connected to herein), a scribing machine 1410, a cutting machine 1415, a deposition machine 1420, and a stretching platform and machine 1425. Scribing machine 1410 is used to scribe a wafer 1430 as described herein. After scribing the wafer 1300, the scribed wafer 1300 is placed on stretching platform and machine 1425 for stretching. A deposition machine 1420 is used to deposit the optically opaque material after the first stretching, after the seconding stretching or combinations thereof. Upon completion of the stretching to create segments as in FIG. 1 or segmented matrix LEDs as in FIG. 11 and hardening of the optically opaque material, cutting machine 1415 is used to cut or dice the wafer 1300 into LED packages for use in electronic packages. The machines described herein are illustrative and other similar machines can be used.

The embodiments described herein may be used for any suitable LED and/or light emitting device. Embodiments of the invention are not limited to the particular structures illustrated, such as, for example, the wafers of FIGS. 2-7 and packages of FIGS. 9-10 and 12-13. The principles described herein may be applicable to light emitting devices made from a variety of materials systems such as other III-V materials, III-phosphide, III-arsenide, II-VI materials, ZnO, or Si-based materials.

The non-limiting methods described herein for dual stretching of wafer for isolated chip scale package segments may be modified for a variety of applications and uses while remaining within the spirit and scope of the claims. The implementations and variations described herein, and/or shown in the drawings, are presented by way of example only and are not limiting as to the scope and spirit. The descriptions herein may be applicable to all implementations of the method for dual stretching of wafer for isolated chip scale package segments although it may be described with respect to a particular implementation.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the method for dual stretching of wafer for isolated chip scale package segments as described herein, and are considered to be within the full scope of the invention.

Some features of some implementations may be omitted or implemented with other implementations. The device elements and method elements described herein may be interchangeable and used in or omitted from any of the examples or implementations described herein.

Although features and elements are described above in particular combinations, each feature or element can be used alone without the other features and elements or in various combinations with or without other features and elements.

What is claimed is:

1. A method for dual stretching of a wafer, the method comprising:
   scribing a wafer along at least one segment line, each segment defined by the at least one segment line having a predetermined number of light emitters;
   stretching first tape carrying the scribed wafer;
   scribing the wafer, after stretching the first tape, along at least one light emitter line, each light emitter section defined by the at least one light emitter line;
   stretching second tape carrying the wafer scribed along the at least one light emitter line; and
   filling gaps between at least one of the segments or sections created by the stretching of at least one of the first or second tape with optically opaque material.

2. The method of claim 1, the method further comprising:
   cutting the wafer, after filling the gaps with the optically opaque material, into light emitter segments, each having a different light emitter.

3. The method of claim 1, wherein the wafer is scribed along two segment lines.

4. The method of claim 3, wherein the wafer is scribed along two light emitter lines.

5. The method of claim 1, wherein the optically opaque material is a metal.

6. The method of claim 5, the method further comprising:
   depositing insulation layers to provide electrical separation between metal layers that form the metal.

7. The method of claim 5, wherein the metal provides electrical connectivity between the segments.

8. The method of claim 5, wherein the metal provides electrical connectivity between the light emitters.

9. The method of claim 1, wherein the first tape and the second tape are same.

10. The method of claim 1, further comprising:
    removing the first tape after stretching the wafer, and
    placing the wafer on the second tape after scribing the wafer along the at least one light emitter line.

11. The method of claim 1, further comprising:
    depositing the optically opaque material between the gaps via flow deposition; and
    allowing the optically opaque material to harden or cure after deposition.

12. The method of claim 1, further comprising:
    filling the gaps between the segments and the gaps between the sections with a same type of optically opaque material.

13. The method of claim 12, further comprising:
    filling the gaps between the segments and the gaps between the sections with the optically opaque material:

after the stretching of the first tape and before the scribing the wafer along the at least one light emitter line, and after the stretching of the second tape.

14. The method of claim 1, further comprising:

filling the gaps between the segments and the gaps between the sections with different types of optically opaque material.

\* \* \* \* \*